(12) United States Patent
Mozak et al.

(10) Patent No.: US 8,514,533 B2
(45) Date of Patent: Aug. 20, 2013

(54) METHOD, APPARATUS, AND SYSTEM FOR PROTECTING SUPPLY NODES FROM ELECTROSTATIC DISCHARGE

(75) Inventors: Christopher P. Mozak, Beaverton, OR (US); Victor Zia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 472 days.

(21) Appl. No.: 12/822,901

(22) Filed: Jun. 24, 2010

(65) Prior Publication Data

US 2011/0317316 A1 Dec. 29, 2011

(51) Int. Cl.
*H02H 9/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 5,255,146 A * | 10/1993 | Miller | 361/56 |
| 5,530,612 A | 6/1996 | Maloney | |
| 5,654,862 A | 8/1997 | Worley et al. | |
| 5,719,737 A | 2/1998 | Maloney et al. | |
| 5,733,794 A | 3/1998 | Gilbert et al. | |
| 5,825,603 A | 10/1998 | Parat et al. | |
| 5,835,328 A | 11/1998 | Maloney et al. | |
| 5,877,927 A | 3/1999 | Parat et al. | |
| 5,907,464 A | 5/1999 | Maloney et al. | |
| 5,917,336 A * | 6/1999 | Smith et al. | 326/30 |
| 5,946,177 A | 8/1999 | Miller et al. | |
| 5,956,219 A | 9/1999 | Maloney et al. | |
| 6,008,970 A | 12/1999 | Maloney et al. | |
| 6,327,126 B1 | 12/2001 | Miller et al. | |
| 6,510,033 B1 | 1/2003 | Maloney et al. | |
| 6,545,520 B2 | 4/2003 | Maloney et al. | |
| 6,570,225 B2 | 5/2003 | Parat et al. | |
| 6,862,160 B2 | 3/2005 | Maloney et al. | |
| 6,867,956 B2 | 3/2005 | Clark et al. | |
| 7,027,275 B2 * | 4/2006 | Smith | 361/56 |
| 7,230,806 B2 | 6/2007 | Poon et al. | |
| 7,339,770 B2 | 3/2008 | Maloney et al. | |

(Continued)

FOREIGN PATENT DOCUMENTS

| EP | 0 905 851 | 3/1997 |
|---|---|---|
| JP | H8-241996 | 9/1996 |

(Continued)

OTHER PUBLICATIONS

Second Office Action mailed May 16, 2012 for Chinese Patent Application No. 2011 20288558.6.

(Continued)

*Primary Examiner* — Ronald W Leja
(74) *Attorney, Agent, or Firm* — Blakely, Sokoloff, Taylor & Zafman LLP

(57) ABSTRACT

Described herein are a method, apparatus, and system for electrostatic discharge protection of supplies. The apparatus comprises a timer unit having a node with a first supply signal and operable to generate a first timer signal based on the first supply signal; and a clamp unit, coupled to the timer unit and having a node with a second supply signal, operable to clamp the second supply signal in response to electrostatic discharge (ESD) on the node with the second supply signal for a duration based on a signal level of the first timer signal.

28 Claims, 12 Drawing Sheets

(56) References Cited

U.S. PATENT DOCUMENTS

| | | | |
|---|---|---|---|
| 7,589,945 B2* | 9/2009 | Miller et al. | 361/56 |
| 7,817,386 B2* | 10/2010 | Ker et al. | 361/56 |
| 2006/0039093 A1* | 2/2006 | Gauthier et al. | 361/56 |
| 2007/0097570 A1* | 5/2007 | Chatty et al. | 361/56 |
| 2007/0223163 A1* | 9/2007 | Hung et al. | 361/93.1 |
| 2008/0062597 A1* | 3/2008 | Chen et al. | 361/56 |
| 2008/0106834 A1* | 5/2008 | Hung | 361/56 |
| 2009/0097174 A1* | 4/2009 | Ker et al. | 361/56 |
| 2011/0222196 A1* | 9/2011 | Smith | 361/56 |
| 2011/0317316 A1* | 12/2011 | Mozak et al. | 361/56 |

FOREIGN PATENT DOCUMENTS

| | | |
|---|---|---|
| JP | H11-178205 | 7/1999 |
| JP | H11-196528 | 7/1999 |
| JP | 2009534845 | 9/2009 |
| WO | WO-2007/124079 | 11/2007 |

OTHER PUBLICATIONS

Maloney, T. et al., "Designing Power Supply Clamps for Electrostatic Discharge Protection of Integrated Circuits", Microelectronics Reliability vol. 38, No. 11, pp. 1691-1703, Nov. 1998.
Maloney, T. et al., "Methods for Designing Low-Leakage Power Supply Clamps", 2003 EOS/ESD Symposium, pp. 24-33. Also published as "Methods for Designing Low-Leakage ISD Power Supply Clamps" in Journal of Electrostatics, vol. 62, pp. 85-97 (2004).
Maloney, T. J. et al., "Novel Clamp Circuits for IC Power Supply Protection", 1995 EOS/ESD Symposium Proceedings, pp. 1-12. Revised version published in IEEE Trans. on Components, Packaging, and Manufacturing Technology, Part C, vol. 19, pp. 150-161, Jul. 1996.
Maloney, T. et al., "Protection of High Voltage Power and Programming Pins", 1997 EOS/ESD Symposium Proceedings, pp. 246-254. Revised version published in IEEE Trans. on Components, Packaging, and Manufacturing Technology—part C, vol. 21, pp. 250-256, Oct. 1998.
Maloney, T. et al., "Stacked PMOS Clamps for High Voltage Power Supply Protection", 1999 EOS/ESD Symposium Proceedings, pp. 70-77. Also published in Microelectronics Reliability, vol. 41, No. 3, pp. 335-348 (Mar. 2001).
Poon, S. et al., "New Considerations for MOSFET Power Clamps", 2002 EOS/ESD Symposium Proceedings, pp. 1-5. Also published in Microelectronics Reliability, vol. 43, pp. 987-991 (2003).
First Office Action mailed Dec. 28, 2011 for Chinese Patent Application No. 2011 20288558.6.
International Search Report and Written Opinion mailed Feb. 9, 2012 for Int'l Application No. PCT/US2011/041530.
Notice of Allowance mailed Oct. 10, 2012 for Chinese Patent Application No. 2011 2028558.6.
Non-Final Notice of Reasons for Rejection issued for Japanese Patent Application No. 2011-114898, mailed Mar. 19, 2013, 5 pages.
Non-Final Notice of Reasons for Rejections mailed Dec. 18, 2012 for Japanese Patent Application No. 2011-114898, 6 pages.
Notification Concerning Transmittal of International Preliminary Report on Patentability mailed Jan. 10, 2013 for Intentional Patent Application No. PCT/US2011/041530.

\* cited by examiner

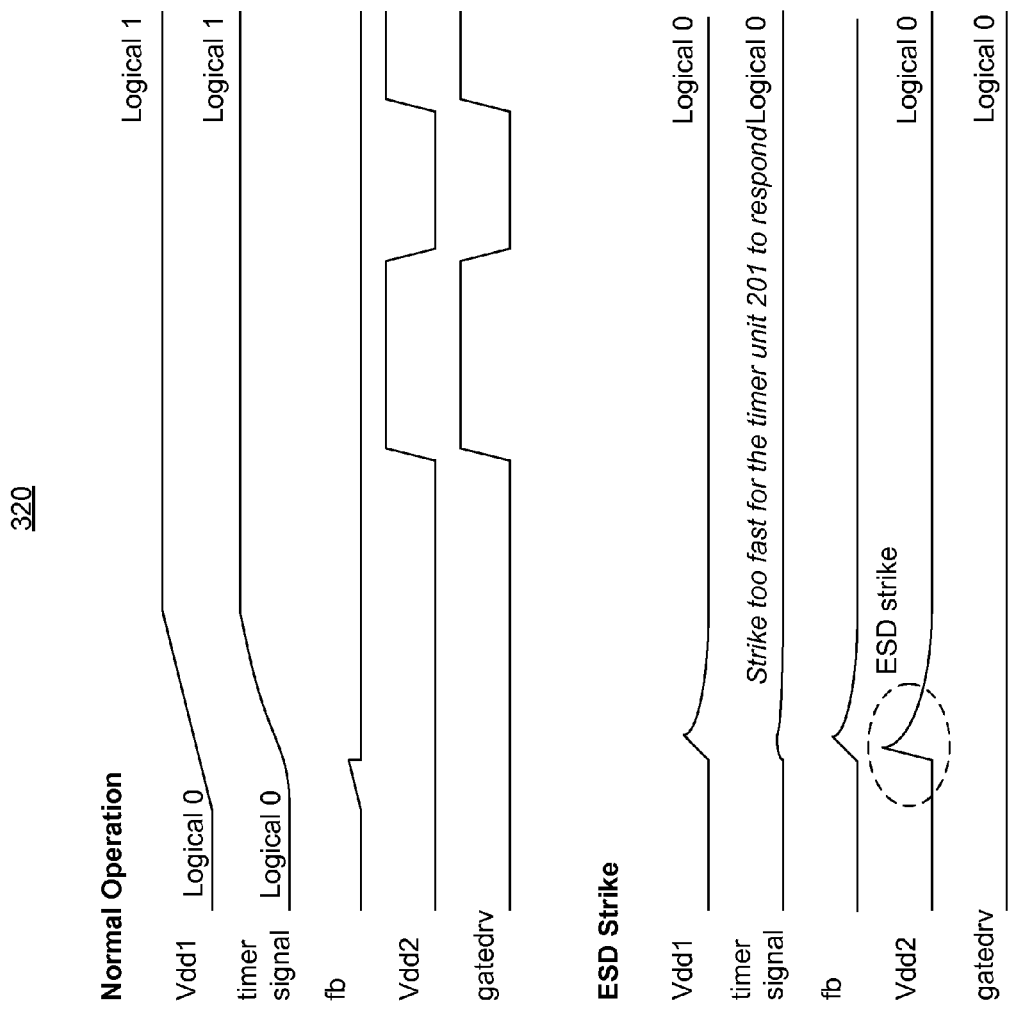

400

METHOD, APPARATUS, AND SYSTEM FOR PROTECTING SUPPLY NODES FROM ELECTROSTATIC DISCHARGE

FIELD OF THE INVENTION

Embodiments of the invention relate generally to the field of processors. More particularly, embodiments of the invention relate to a method, an apparatus, and a system for protecting power and/or ground supply nodes from electrostatic discharge (ESD) to enable a fast ramp of supply signal on those nodes.

BACKGROUND

During manufacturing of integrated circuits (ICs) or during handling of such ICs, the power or ground supply nodes/pins to the ICs may experience a high supply voltage and current (e.g., several thousand volts and currents of several amperes, positive and/or negative with respect to a local ground). These high supply voltages and currents signify an electrostatic discharge (ESD) event on the nodes, and may damage the circuits coupled to the power and/or ground nodes/pins of the ICs. The power and/or ground supply nodes/pins may also experience an ESD event indirectly when other circuits coupled to the power and/or ground supply nodes/pins experience an ESD event. In such a case, the ESD on the other circuits flows through electrical paths to the power and/or ground supply nodes/pins thus causing damage to those nodes/pins and to circuits coupled to those nodes/pins. To protect these circuits, ESD protection circuits are included in the ICs to short the power supply and ground supply nodes of the IC to one another in case of an ESD event on such supply nodes.

Such ESD protection circuits protect the ICs by clamping the high or low voltage signals on the supply nodes (power supply and ground nodes). Consequently, a rapidly changing voltage (e.g., 10 mV/μS or faster) on a supply node of the IC may appear as an ESD event to the ESD protection circuit which responds to the ESD event by shorting the nodes having the supplies (power supply and ground supply) to one another to discharge the large currents (several amperes) associated with the ESD event. By discharging the large currents associated with the ESD event, buildup of high voltages on circuit nodes of the ICs is prevented.

FIG. 1 illustrates a traditional ESD protection circuit 100 having a timer unit 101 coupled to a clamp unit 102. The time constant of the timer unit 101 is selected to be shorter than the ramp time of the supply signal Vdd and longer than the duration of the ESD event. Such time constant allows the clamp unit 102 to turn on when the ESD event begins on the node having the supply signal Vdd, and to turn off after the ESD event completes on the node having the supply signal Vdd. The supply signal Vdd is generally generated by external voltage regulators (external to the IC) on the motherboard and so ESD protection is needed for such signals that are exposed external to the IC. Such external voltage regulators generally generate the supply signal Vdd with a slow ramp speed e.g., 1 mV/μS.

However, for efficient power management of ICs, advanced power generators are used that generate supply signals with fast ramp speeds (e.g., 1-10K mV/μS). These fast ramping supply signals allow the ICs to go in and out of power states to save power consumption and to improve IC performance. These fast ramping supply signals appear to an ESD protection circuit (such as the ESD protection circuit 100 of FIG. 1) as an ESD event because like an ESD event, the fast ramping supply signals ramp up or down at speeds similar or equal to a sudden high voltage spike (an ESD event) on the supply nodes of the ICs. Consequently, the ESD protection circuits (such as the ESD protection circuit 100 of FIG. 1) are unable to distinguish between a fast ramping supply signal and an ESD event on a node with the supply signal. Hence, such ESD protection circuits clamp the fast ramping supply signals used, for example, for power management of the ICs and thus disrupt power management of the ICs.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 3C illustrates a timing diagram of the ESD protection circuit of FIG. 3B, according to one embodiment of the invention.

DETAILED DESCRIPTION

Figure 1:
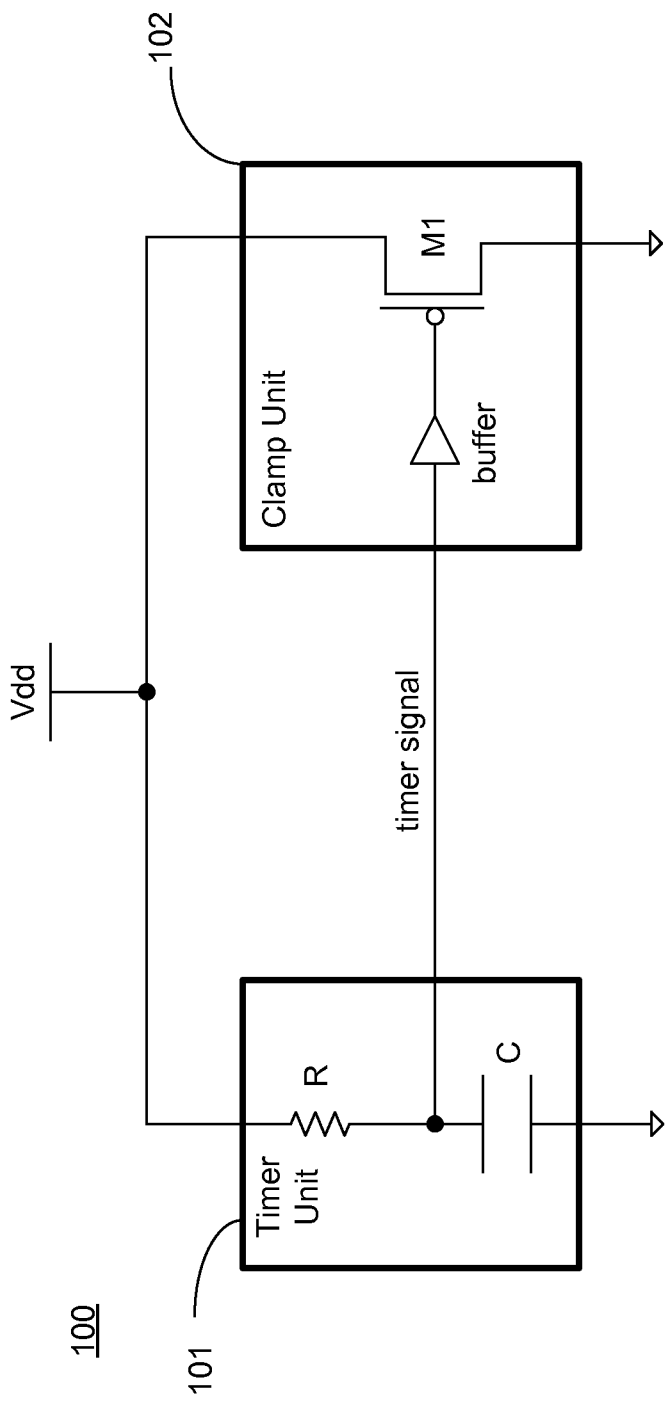
FIG. 1 illustrates a traditional electrostatic discharge (ESD) protection circuit operating via a node having a single power supply which is being protected from an ESD event.

Embodiments of the invention relate to a method and an apparatus for protecting power and/or ground supply nodes from electrostatic discharge (ESD) to enable fast ramp of supply signal on those nodes.

In one embodiment, an ESD protection circuit of an integrated circuit (IC) is configured so that its timer unit is decoupled from the ESD circuits' clamp unit. Details of the embodiment are discussed below with reference to FIGS. 2-8. In one embodiment, the timer unit of the ESD protection circuit is operable to generate a first timer signal via a first supply signal, where the first supply signal is a slow ramping supply signal (e.g., 1 mV/μS).

The term ramp refers herein to the up and/or down slope of the supply signals. In one embodiment, the clamp unit of the ESD protection circuit is operable to clamp a second supply signal in case of an ESD event on the node having the second supply signal. In such an embodiment, the clamp unit is operable to clamp the second supply signal for the duration of the first timer signal.

The term decouple refers herein to electrically separating the source of the ground and/or supply signals of the timer unit and the clamp unit from one another. For example, the supply signal provided to the clamp unit may be generated by an internal (e.g., on-die) voltage generator may use the first supply signal, where the first supply signal is generated by an external (e.g., off-die) voltage generator.

The above embodiment allows the second supply signal to have a faster ramp speed (e.g., 1-10K mV/μS or faster) compared to a ramp speed of the first supply signal (e.g., 1 mV/μS) without prompting the ESD protection circuit to clamp the second supply signal even with the second supply signals' much faster ramp speed. One reason for the capability of faster ramp speed for the second supply signal without clamping the second supply signal is that the first timer signal from the timer unit, which determines when to clamp the second supply signal, is based on the first supply signal.

The above embodiment thus allows the clamp unit to distinguish between an ESD event (a voltage spike on the node with the second supply signal) and a fast ramping second supply signal. Such an embodiment allows efficient power management of the IC by powering up and down the components of the IC in a fast manner (e.g., 1-10K mV/μS vs. 1 mV/μS) without causing the clamp device of the ESD circuit to turn on and thus clamp the second supply signal. The embodiments discussed herein also reduce leakage power consumption in the clamp devices of the clamp unit, which are large transistors compared to typical logic transistors, by shutting off the decoupled second power supply (supply to the clamp unit) during a power down mode of the IC.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction any may be implemented with any suitable type of signal scheme, e.g., differential pair, single-ended, etc.

Figure 2:
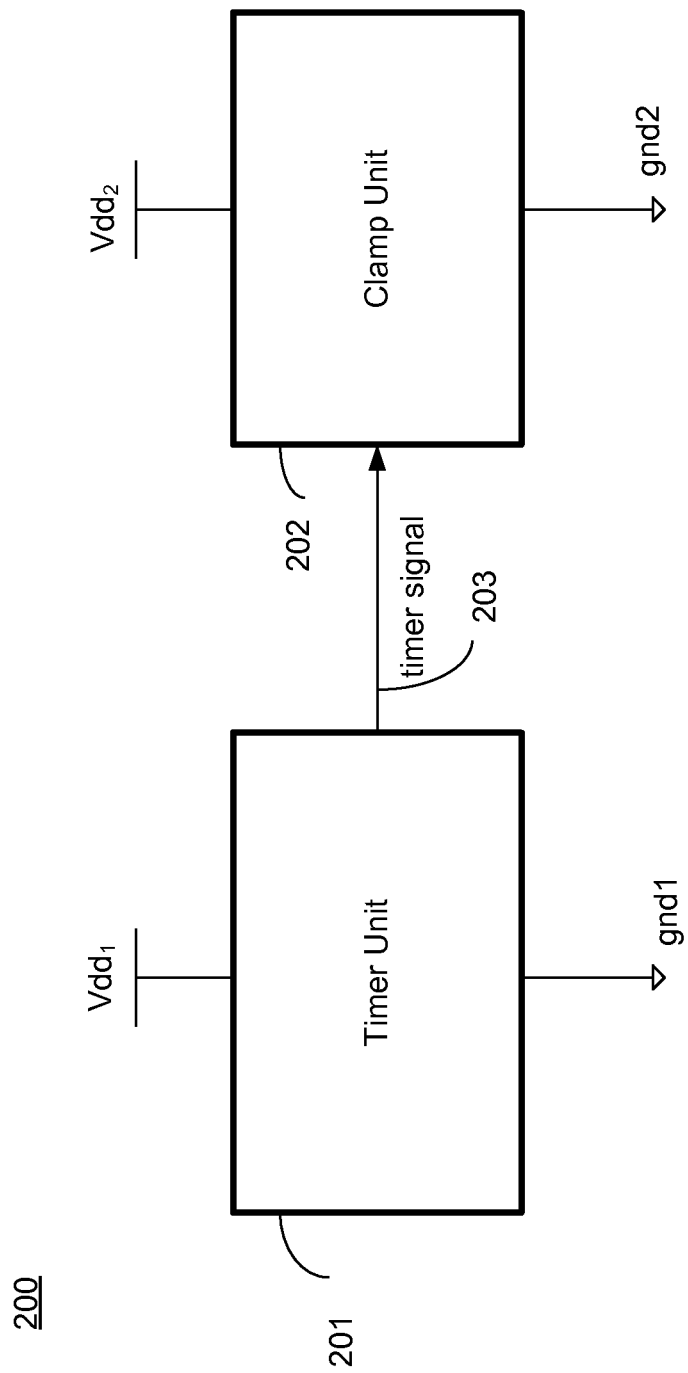
FIG. 2 illustrates a high level block diagram of an ESD protection circuit for a fast ramping supply, according to one embodiment of the invention.

FIG. 2 illustrates a high level block diagram of an ESD protection circuit 200, according to one embodiment of the invention. In one embodiment, the ESD protection circuit 200 comprises a timer unit 201 coupled to a clamp unit 202. In one embodiment, the timer unit 201 is operable to generate a timer signal 203 with a time constant long enough to cover an entire ESD event. In one embodiment, the timer unit 201 has a node with a power supply signal Vdd1 and a ground supply signal gnd1. In such an embodiment, the power supply signal Vdd1 has a slow ramp speed (e.g., 1 mV/μS) and is generated by a first voltage generator.

So as not to obscure the embodiments of the invention, the structure of the first voltage generator is not shown. In one embodiment, the first voltage generator is an off-die voltage regulator residing on a motherboard away from the IC. In another embodiment, the first voltage generator is an on-die voltage regulator operable to generate the first supply signal at a slow ramp speed (e.g., 1 mV/μS).

In one embodiment, the clamp unit 202 is operable to receive the timer signal 203 and to generate a buffered timer signal 203 to drive a clamp device (not shown) of the clamp unit 202. As mentioned above, the clamp unit 202 is decoupled from the timer unit 201 so that the clamp unit 202 operates on a different supply (power and/or ground) than the supply (power and/or ground) of the timer unit 201. In one embodiment, the clamp unit 202 has a node with a second supply signal Vdd2 which has a faster ramp speed (e.g., 1-10K mV/μS) compared to the ramp speed of the first supply signal Vdd1 (e.g., 1 mV/μS) of the timer unit 201.

In one embodiment, the node with the second supply signal Vdd2 is exposed to conditions external to the IC via C4 bumps of the IC die which are coupled to bond wires and/or die package. In such an embodiment, the node with the second supply signal Vdd2 is exposed to an ESD event. In one embodiment, the node with the second supply signal Vdd2 provides the supply signal to input-output (I/O) transceivers of the IC, wherein the I/O transceivers and thus the node with the second supply signal are exposed to ESD through the I/O transceivers from the I/O pins. The embodiments described herein discuss ESD protection for the node with the second supply signal Vdd2.

In one embodiment, the clamp device in the clamp unit 202 is an NMOS transistor operable to short the node with the second supply to a node with a ground signal in response to an ESD event on the node with the ground signal. In another embodiment, the clamp device in the clamp unit 202 is a PMOS transistor operable to short the node with the second supply to a node with a ground signal in response to an ESD event on the node with the second supply signal. In one embodiment, the clamp device in the clamp unit 202 is a PMOS transistor operable to short the node with the second supply to a node with a ground signal in response to an ESD event on the node with the ground supply signal. In one embodiment, the clamp device in the clamp unit 202 is an NMOS transistor operable to short the node with the second supply to a node with a ground signal in response to an ESD event on the node with the second supply signal.

So as not to obscure the embodiments, the following embodiments are discussed with reference to the clamp device being a PMOS transistor and the ESD event being on the node with the second supply signal when the IC is unpowered i.e., when the first and the second supply signals are at logical zero levels. While the clamp device is discussed with regards to clamping the second supply signal Vdd2, the same design can be used to clamp an ESD on the ground supply signal gnd2 via an NMOS transistor without changing the essence of the embodiments of the invention.

FIGS. 3-4 and FIGS. 7-8 illustrate various embodiments of the ESD circuit 200 of FIG. 2.

Figure 3A:
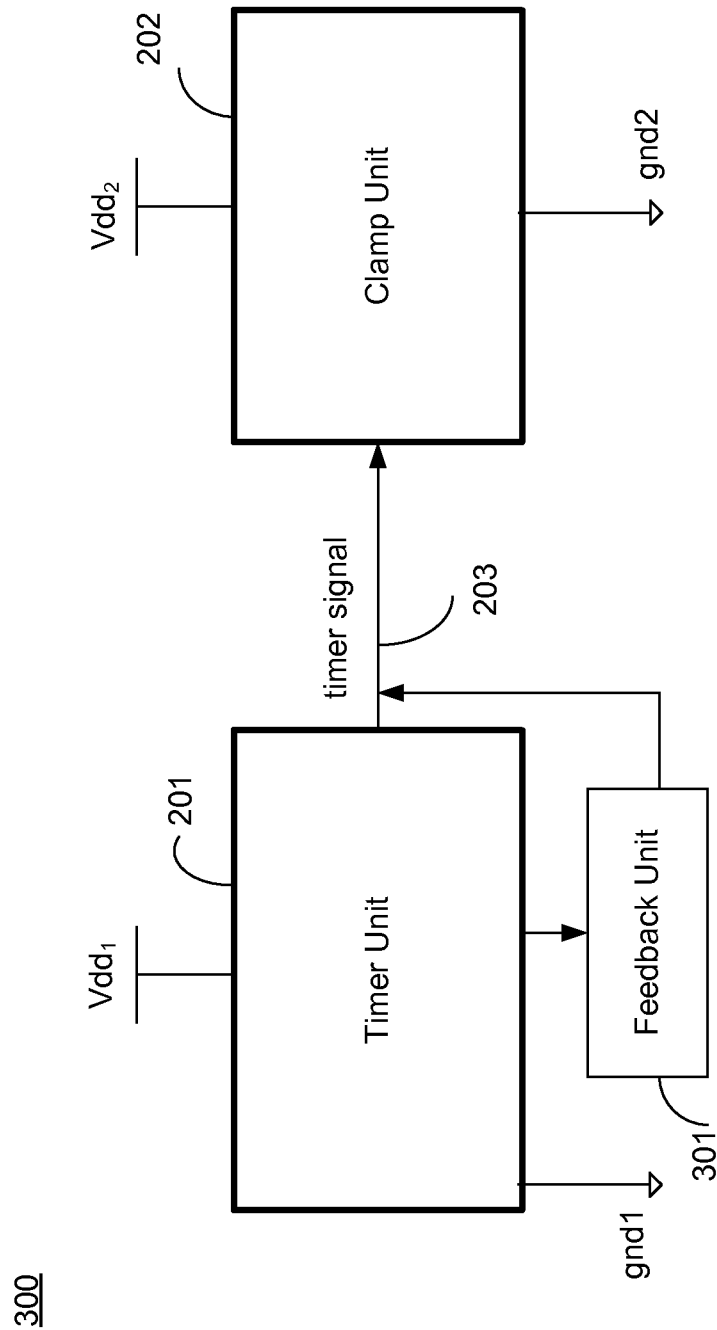
FIG. 3A illustrates a high level block diagram of an ESD protection circuit with a feedback unit coupled to a timer unit of the ESD protection circuit, according to one embodiment of the invention.

FIG. 3A illustrates a high level block diagram of an ESD protection circuit 300 with a feedback unit 301 coupled to the timer unit 201 of the ESD protection circuit 300, according to one embodiment of the invention. In one embodiment, the feedback unit 301 is operable to generate a feedback signal fb to adjust the timer signal 203. In one embodiment, the feedback unit 301 comprises a keeper device operable to adjust the timer signal 203 when the first supply signal Vdd1 ramps up.

One purpose of the feedback unit 301 is to provide stability to the timer unit 201 by keeping the timer signal 203 at a stable level and not allowing the level of the timer signal 203 to discharge via any electrical leakage or coupling paths in the IC. By keeping the timer signal 203 at a stable level and not allowing it to discharge via leakage or coupling paths, the clamp unit 202 does not clamp the node with the second supply signal Vdd2 to the node with the ground signal in response to a discharged timer signal 203. In one embodiment, in response to an ESD event on the node with the second supply signal Vdd2, the feedback unit 301 is disabled because the timer signal remains discharged. As mentioned above, the IC is in a power down state during an ESD event and so the nodes with the first and the second supply nodes are at logical zero levels just before an ESD event.

Figure 3B:
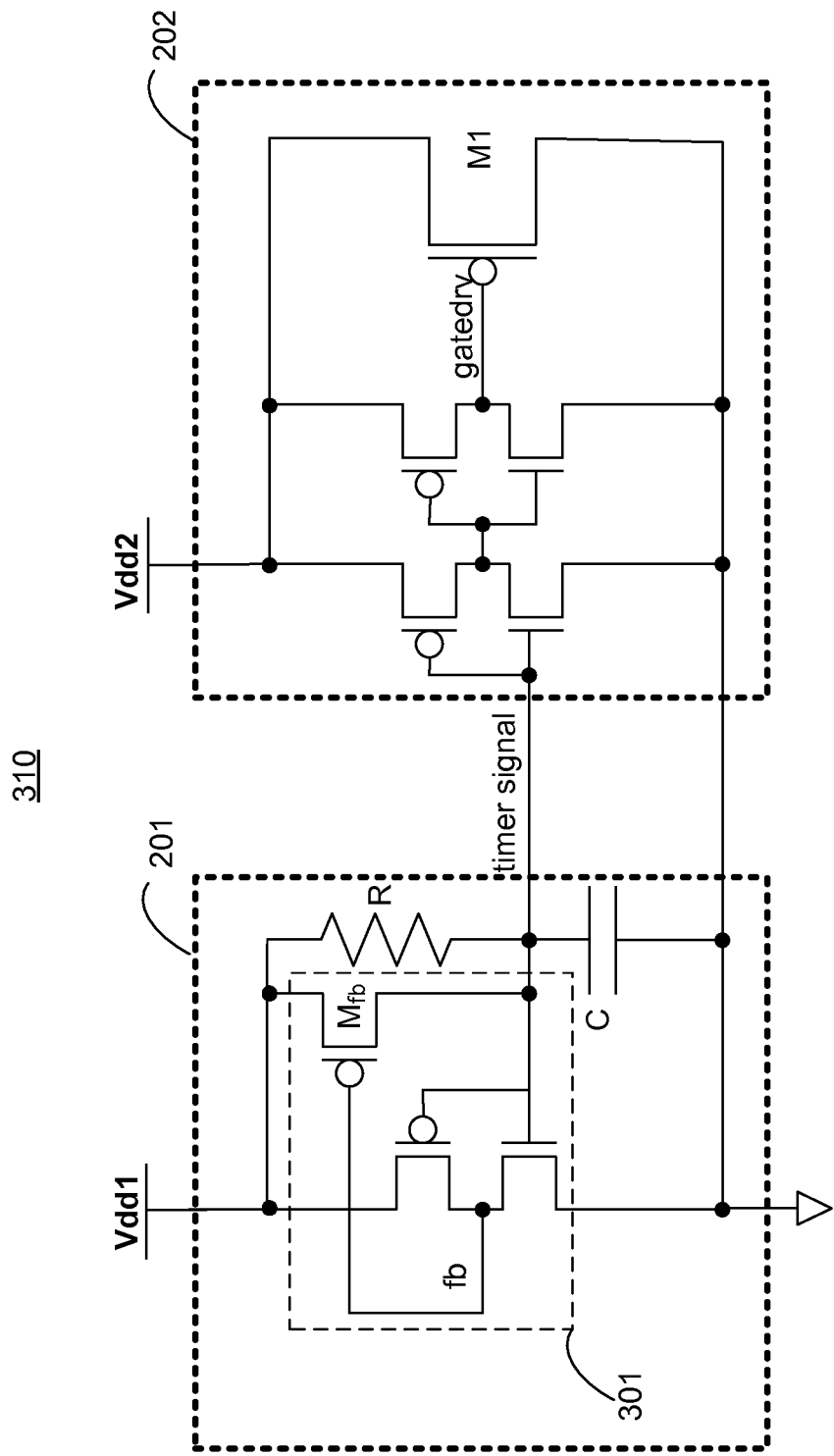
FIG. 3B illustrates a circuit level diagram of the ESD protection circuit of FIG. 3A, according to one embodiment of the invention.

FIG. 3B illustrates a circuit level diagram 310 of the ESD protection circuit 300 of FIG. 3A, according to one embodiment of the invention. In one embodiment, the timer unit 201 comprises a resistor (R) and a capacitor (C) to generate a timer signal 203 with a time constant long enough to cover the duration of an ESD event on the nodes with the second supply signal. The embodiments of the timer unit 201 are not limited to an RC based timer unit. In another embodiment, the timer unit 201 comprises an LC timer and a ring oscillator based timer (not shown). So as not to obscure the embodiments of the invention, other devices such as coupling capacitors on various nodes of the ESD protection circuit 300 to ensure that the ESD protection circuit 300 responds correctly to an ESD event are not shown.

In one embodiment the feedback unit 301 comprises a keeper device $M_{fb}$ operable to be driven by an inverter which is further operable to invert the timer signal 203 to generate a feedback signal fb. In one embodiment, the timer unit 201 is operable to receive the first supply signal Vdd1.

In one embodiment, the clamp unit 202 is operable to receive the timer signal 203. In one embodiment, the clamp unit 202 comprises a buffer and a clamp device M1. In such an embodiment, the buffer is operable to generate a gatedrv signal from the timer signal 203 to drive the clamp device M1. In one embodiment, the clamp device is a PMOS transistor operable to short a node with the second supply signal Vdd2 to a node with a ground signal. As mentioned with reference to the embodiment of FIG. 2, the clamp unit 202 is operable to receive a second supply signal Vdd2 which is decoupled from the first supply signal Vdd1.

As discussed later with reference to the embodiment of FIG. 6, the first supply signal Vdd1 may be used to generate the second supply signal Vdd2. In one embodiment, the first supply signal Vdd1 is generated by a voltage regulator external to the IC. In such an embodiment, the first supply signal Vdd1 is gated by a gating device to generate the second supply signal Vdd2. In one embodiment the gating device is a pass-transistor operable to turn itself on or off in response to a power management signal. In such an embodiment, the second supply signal Vdd2 is decoupled from the first supply signal Vdd1 via the gating device. In other embodiments, the second supply signal Vdd2 is generated by an internal voltage regulator via the first supply signal Vdd1. In one embodiment, the internal voltage generator is an on-die or on package voltage regulator.

FIG. 3C illustrates a timing diagram 320 of the ESD protection circuit of FIG. 3B, according to one embodiment of the invention. The timing diagram is based on the assumption that while the second supply signal Vdd2 is decoupled from the first supply signal Vdd1, there may exist an electrical path between the two nodes with the supplies e.g., a leakage path from the node with the second supply signal Vdd2 via the buffer of the clamp unit 202, the node having the timer signal 203, the feedback unit 301, the RC network, etc, to the node with the first supply signal Vdd1. A leakage or coupling path may also exist via another circuit that is not part of the ESD protection circuit of FIG. 3B.

Referring back to FIG. 3C, the leakage path causes a ripple effect on the node with the first supply signal in response to an ESD event on the node with the second supply signal. However, such an assumption of an electrical path between the nodes with the supply signal is not a limitation to the embodiments of the invention. The embodiments of the invention protect the node with the second supply signal Vdd2 during an ESD event on that node for anything between a perfect isolation and a perfect short between the nodes with the first and the second supply signals.

In the top half of FIG. 3C, the timer signal 203 tracks the first supply signal Vdd1 as the first supply signal Vdd1 ramps up from a logical zero level to a logical high level. The time constant of the timer unit 201 is configured so that the timer signal 203 tracks the first supply signal Vdd1 as it ramps.

The term track refers herein to the behavior of a first signal such that the ramp speed of the first signal is the same as the ramp speed of a second signal.

As the timer signal ramps up by tracking the first supply signal Vdd1, the feedback signal fb keeps the keeper device $M_{fb}$ turned on. As the second supply signal Vdd2 ramps up, gatedrv signal tracks the second supply signal Vdd2. The logical level of the timer signal 203 ensures that the gatedrv signal to the clamp device M1 is such that the clamp device M1 is off when there is no ESD event on either the nodes with the first supply signal or the second supply signal.

As shown in the bottom half of FIG. 3C, in response to an ESD event on the node with the second supply signal Vdd2, the timer signal 203 remains at or near a logical zero level because the ESD voltage/strike is too fast for the timer unit 201 to respond to. If there is no electrical or coupling path between the nodes with the first and the second supply signals, the timer unit 201 will not respond to the ESD event on the node with the second supply signal. As mentioned above, the IC is in a power down state during an ESD event and so the nodes with the first and the second supply signals (Vdd1 and Vdd2, respectively) are at logical zero levels just before an ESD event.

A logical zero level of the timer signal 203 means that the feedback signal fb keeps the keeper device $M_{fb}$ turned off. However, the logical zero level of the timer signal 203 results in turning on the clamp device M1, thus causing the node with the second supply signal Vdd2 to short to the node with the ground supply signal. The shorting of the two nodes discharges the ESD on the node with the second supply signal Vdd2. The small ripple effect on the first supply signal is caused by an electrical path between the node with the first supply signal and the node with the second supply signal on which an ESD event occurred. As discussed above, the ESD protection circuit of the embodiments will function properly even if there was no electrical path between the node with the first supply signal and the node with the second supply signal on which an ESD event occurred.

Figure 4A:
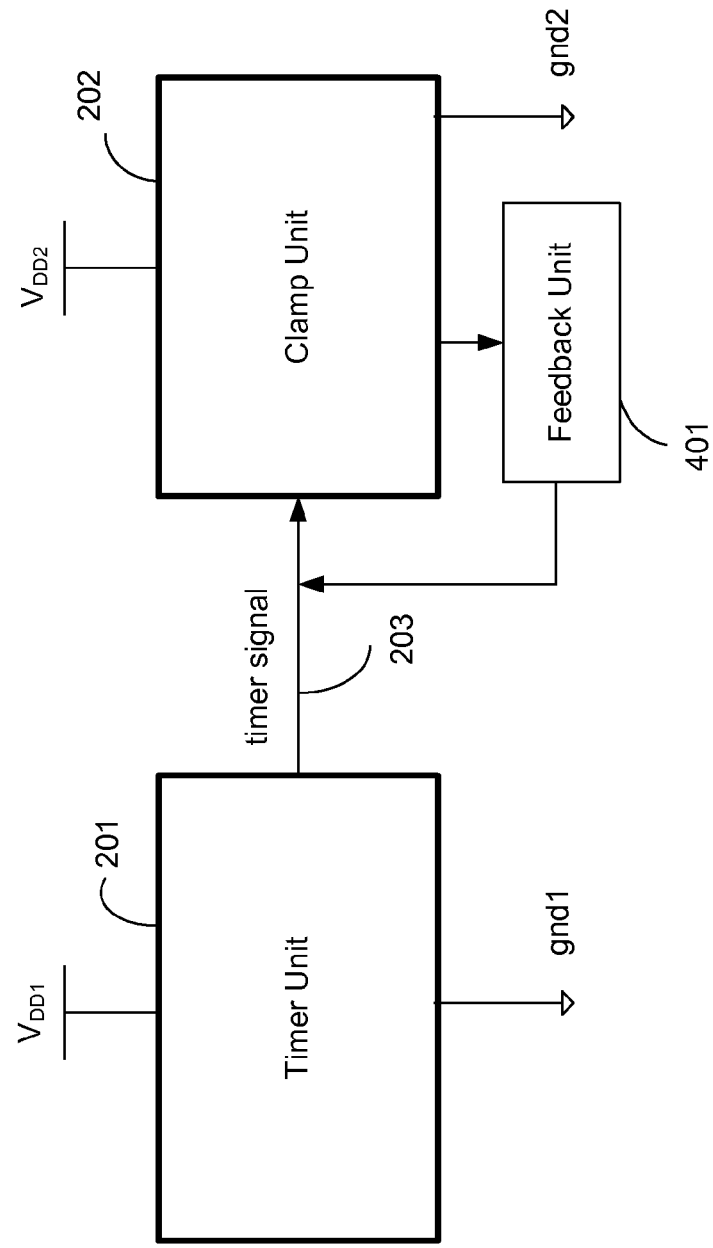
FIG. 4A illustrates a high level block diagram of an ESD protection circuit with a feedback unit coupled to a clamp unit of the ESD protection circuit, according to one embodiment of the invention.

FIG. 4A illustrates a high level block diagram of an ESD protection circuit 400 with a feedback unit 401 coupled to the clamp unit 202 of the ESD protection circuit, according to one embodiment of the invention. The above embodiment is operable to save power consumption over the embodiment of FIG. 3A because the feedback unit 401 can be turned off when the second supply signal Vdd2 is powered down during power management of the IC. The embodiment of FIG. 4A also simplifies the timer unit 201 by removing the feedback unit 301 of FIG. 3A from the timer unit 201. The operation of the feedback unit 401 is discussed with reference to FIG. 4B and FIG. 4C. The remaining components of the ESD protection circuit 400 operate similarly to the operation of the embodiments of the ESD protection circuits of FIG. 2 and FIG. 3.

While the embodiments of FIG. 3A and FIG. 4A illustrate different circuit topologies of an ESD protection circuit with a feedback unit, in one embodiment the feedback unit may be removed without changing the essence of the invention described with reference to FIG. 2.

Figure 4B:
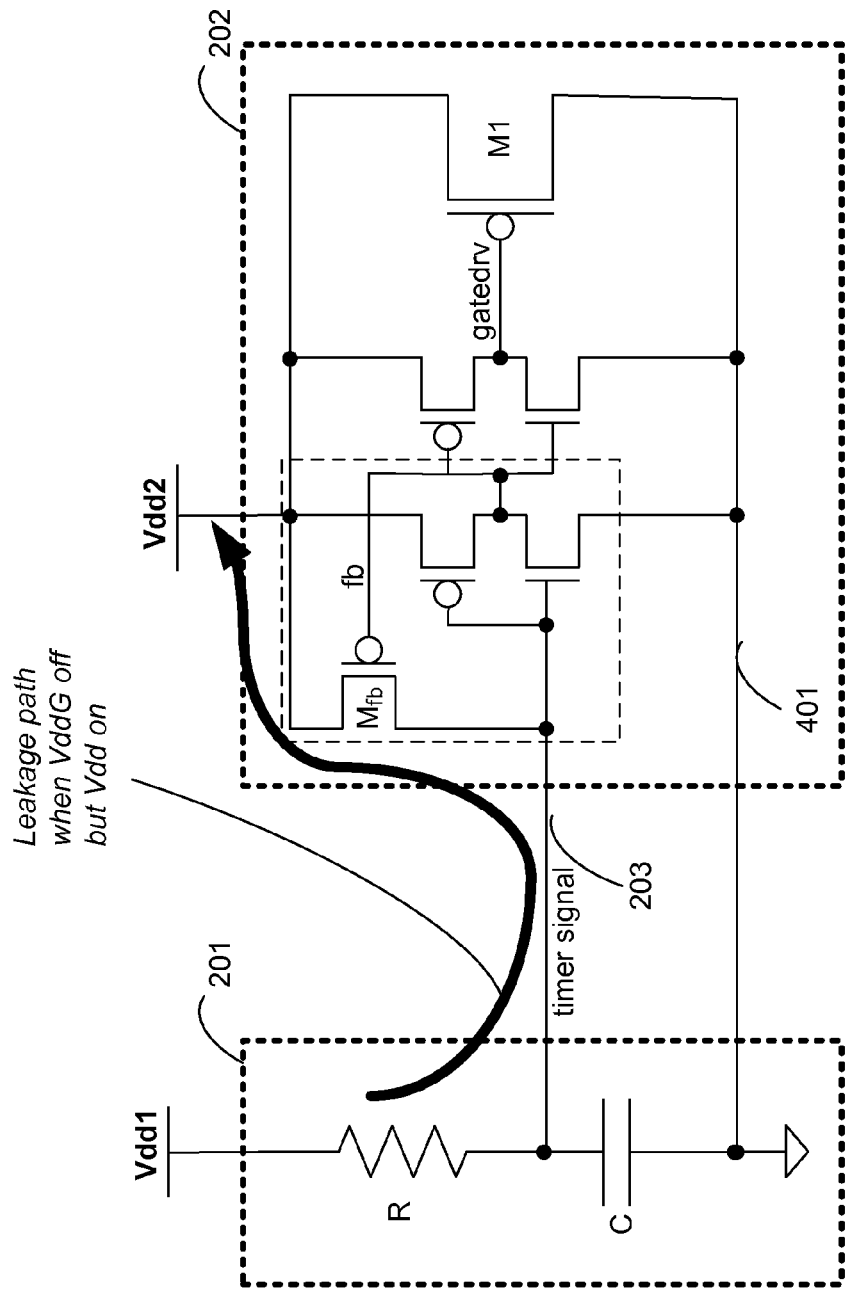
FIG. 4B illustrates a circuit level diagram of the ESD protection circuit of FIG. 4A, according to one embodiment of the invention.

FIG. 4B illustrates a circuit level diagram 410 of the ESD protection circuit of FIG. 4A, according to one embodiment of the invention. In one embodiment, the buffer of the clamp unit 202 is operable to generate a feedback signal fb from the timer signal 203. In one embodiment, the feedback signal fb of the feedback unit 401 controls the feedback transistor $M_{fb}$ by turning it on or off in response to the signal level of the timer signal 203. Since the feedback signal fb in this embodiment is powered by the second supply signal Vdd2, there exists an electrical leakage path when the second supply signal Vdd2 is off (i.e., at a logical zero level) while the first supply signal Vdd1 is on (i.e., at a logical high level) or ramping up. In one embodiment, in response to an ESD event on the node with the second supply signal Vdd2, the feedback signal fb tracks the ESD on the node with the second supply signal Vdd2 because the feedback unit 401 is coupled to the clamp unit 202 which is supplied by the second supply signal Vdd2.

Figure 4C:
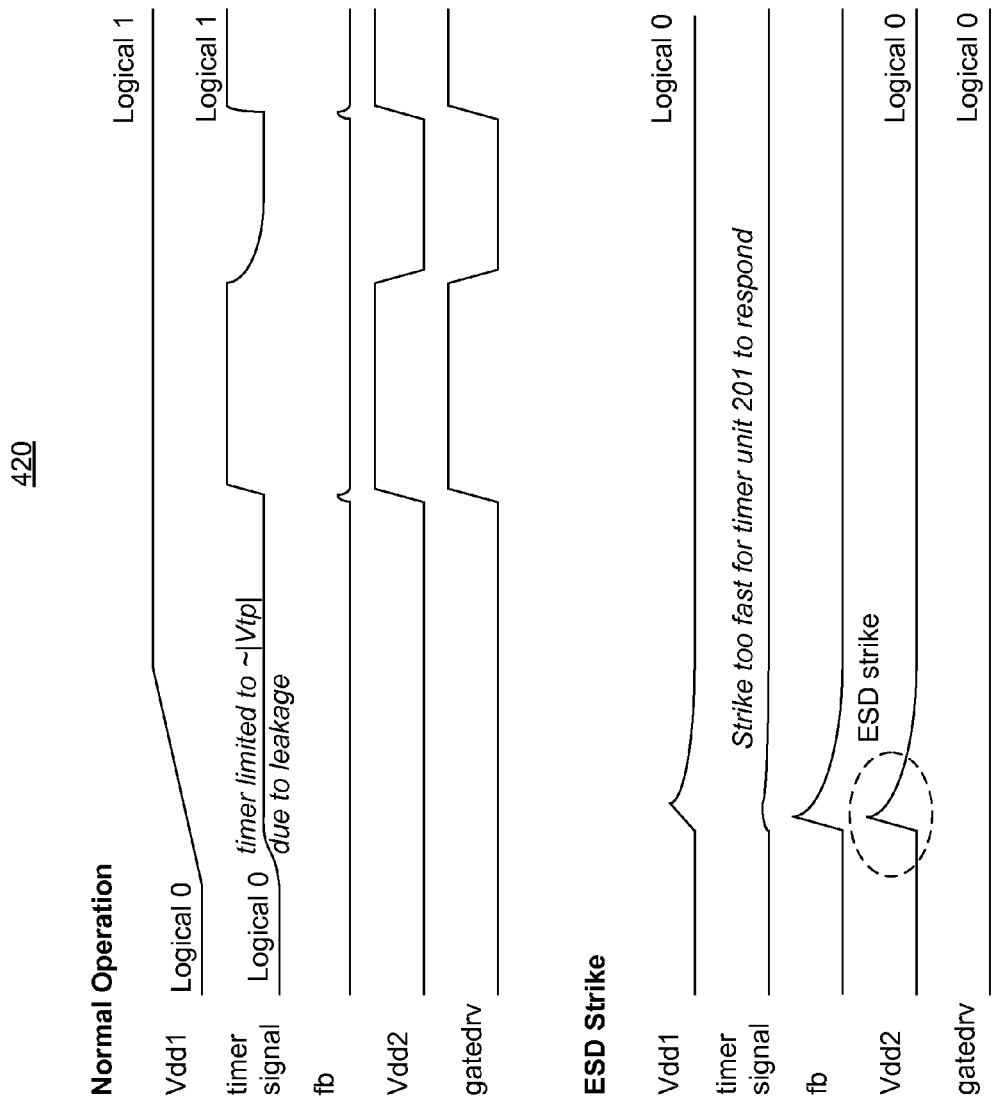
FIG. 4C illustrates a timing diagram of the ESD protection circuit of FIG. 4B, according to one embodiment of the invention.

FIG. 4C illustrates a timing diagram 420 of the ESD protection circuit of FIG. 4B, according to one embodiment of the invention. During normal operation when the first supply signal Vdd1 is ramping up from a logical zero level while the second supply signal Vdd2 is still powered down (i.e., at a logical zero level), the timer signal 203 begins to track the first supply signal Vdd1 and then is limited to a threshold voltage level of the feedback transistor $M_{fb}$. One reason for the timer signal 203 to be limited to the threshold voltage (Vtp) of the transistor $M_{fb}$ is that there exists a leakage path between the nodes with the first supply signal Vdd1 and the node with the second supply signal Vdd2. When the second supply signal Vdd2 ramps up, the timer signal 203 then tracks the second supply signal Vdd2 causing the clamp device M1 to turn off—normal operation.

In response to an ESD event on the node with the second supply signal Vdd2, the timer signal remains at a logical zero level causing the clamp device to turn on and clamp the second supply signal Vdd2. As mentioned above, the IC is in a power down state during an ESD event and so the nodes with the first and the second supply signals (Vdd1 and Vdd2, respectively) are at logical zero levels just before an ESD event. Compared to the embodiment of FIG. 3B, the feedback signal fb in the embodiment of FIG. 4B tracks the ESD on the node with the second supply signal Vdd2 because the feedback unit 401 is supplied by the node with the second supply signal Vdd2.

Figure 5:
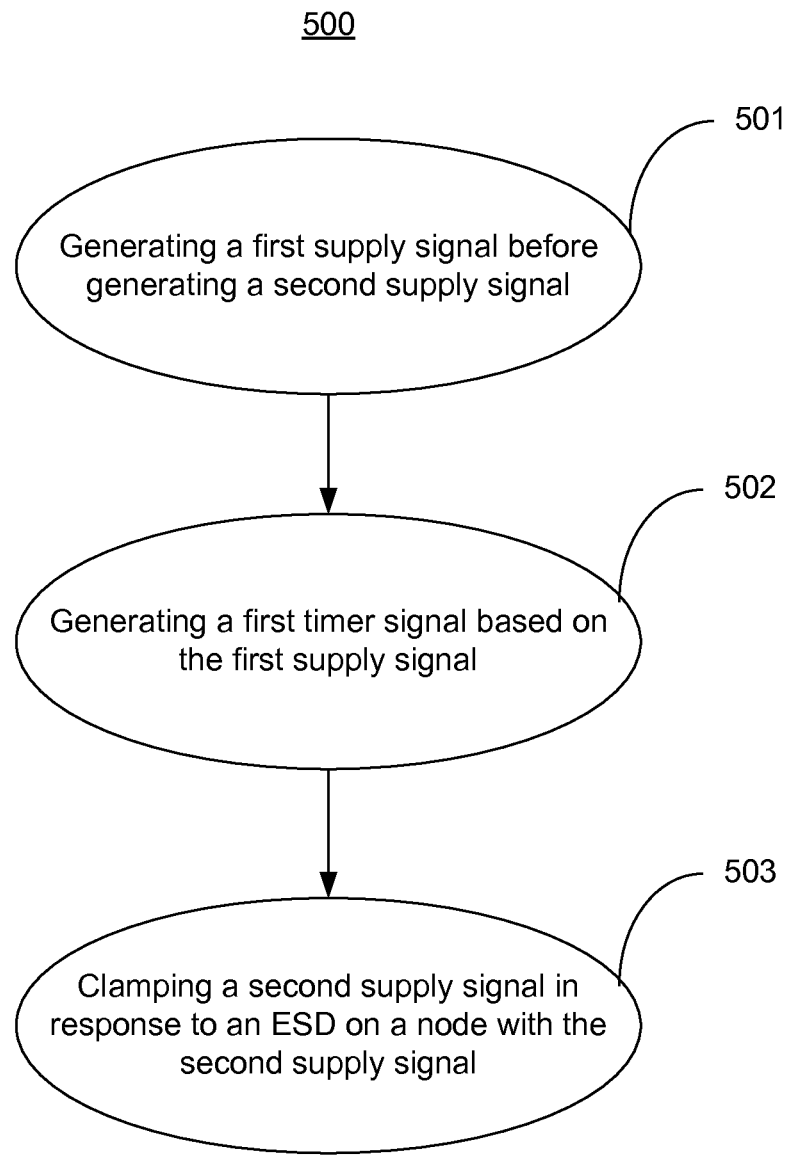
FIG. 5 illustrates a method for protecting an integrated circuit (IC) from an ESD event on the nodes having the supply signals while allowing fast ramping of the supply signals, according to one embodiment of the invention.

FIG. 5 illustrates a method flowchart 500 for protecting an IC from an ESD event while allowing fast ramping of supply signals on the node with the ESD clamping device, according to one embodiment of the invention. The method is discussed with reference to the embodiments of FIGS. 2-4 and FIG. 6-8.

At block 501, the first supply signal Vdd1 is generated before generating the second supply signal Vdd2. At block 502, a first timer signal 203 is generated via a timer unit 201, wherein the first timer signal 203 is based on the first supply signal Vdd1. At block 503, the second supply signal Vdd2 is clamped by the clamp unit 202 in response to an ESD on the node with the second supply signal Vdd2, wherein the clamping process lasts for a duration based on the timer signal 203.

Figure 6:
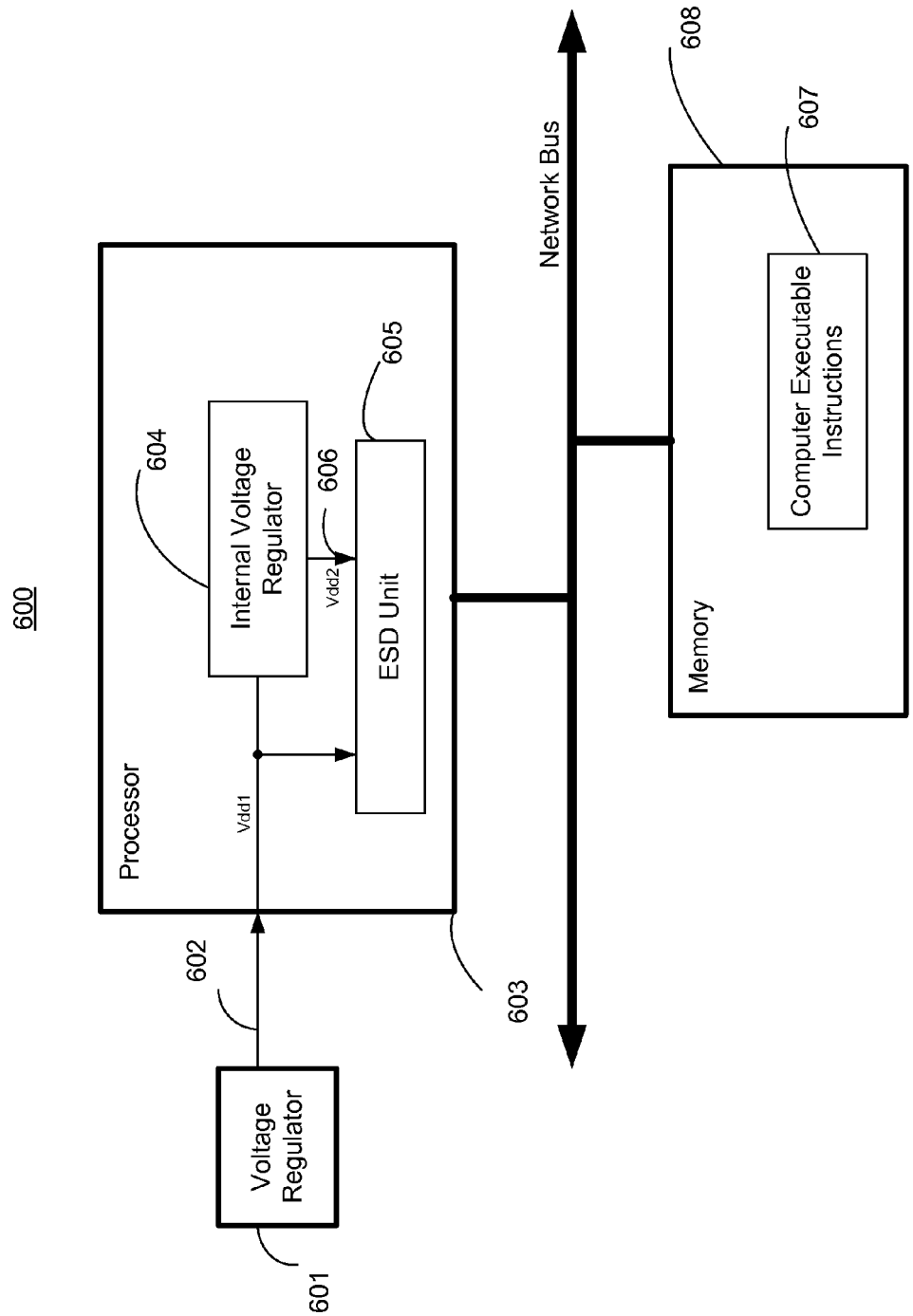
FIG. 6 illustrates a system level diagram for ESD protection of nodes having fast ramping supplies, according to one embodiment of the invention.

FIG. 6 illustrates a system level apparatus 600 for ESD protection, according to one embodiment of the invention. In one embodiment, the system 600 comprises an external voltage regulator 601 coupled to a processor 603 (also referred to as an IC). The system further comprises a memory module 606 having stored thereon computer executable instructions 607, wherein the memory module 606 is coupled to the processor 603 via a network bus. In one embodiment, the external voltage regulator 601 is operable to generate the first supply signal 602 which is received by the processor 603 via a package pin (not shown). In one embodiment, the processor 603 comprises an ESD protection circuit 605 which represents any of the ESD protection circuits of FIGS. 2-5 and FIGS. 7-8.

In one embodiment, the ESD protection circuit 605 is operable to receive a second supply signal 606 from an internal voltage regulator 604. In one embodiment, the internal voltage regulator 604 is operable to receive the first supply signal 602 and generate the second supply signal 606. In other embodiments, the second supply signal 606 is generated by a power gate transistor (not shown) that is operable to receive the first supply signal 602 on one terminal of the power gate transistor and then operable to generate the second supply signal Vdd2 at the other terminal of the power gate transistor. In one embodiment, the power gate transistor is controlled by a power management signal at its gate terminal. In one embodiment, the internal voltage regulator 604 resides on the package of the processor 603. In one embodiment, the internal voltage regulator 604 is an on-die voltage regulator coupled to the ESD protection circuit 605, where both the internal voltage regulator 604 and the ESD protection circuit 605 reside within the processor 603.

Embodiments of the invention are also implemented via programmable computer-executable instructions 607. For example, in one embodiment, the size of the PMOS clamp transistor M1 of FIGS. 3-4 and FIGS. 6-8 is programmable via the computer-executable instructions 607. In one embodiment, the time constant of the timer signal 203 from the timer unit 201 is also programmable via the computer-executable instructions 607. In one embodiment, the ramp speed of the second supply signal is also adjustable via the computer-executable instructions 607. The machine-readable storage medium 608 may include, but is not limited to, flash memory, optical disks, CD-ROMs, DVD ROMs, RAMs, EPROMs, EEPROMs, magnetic or optical cards, or other type of machine-readable storage media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. FIGS. 7-8 illustrate two such alternatives.

Figure 7A:
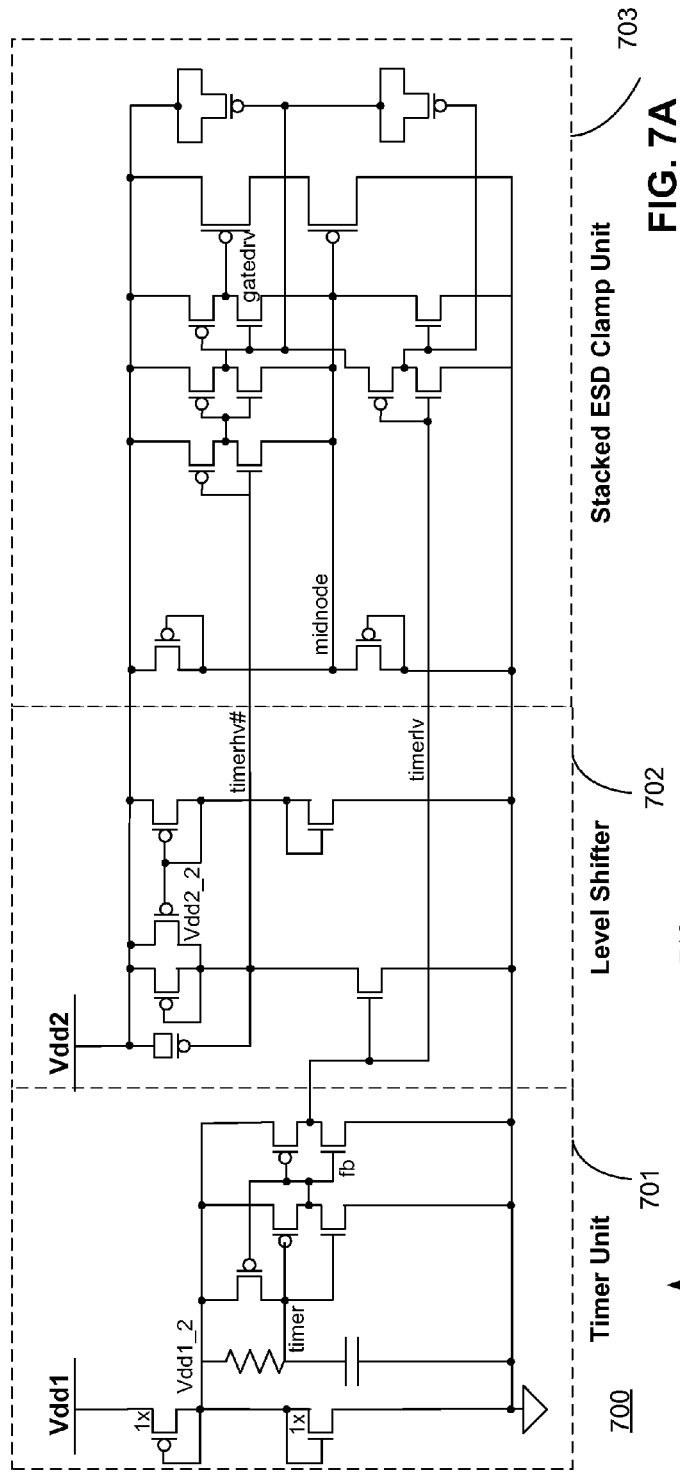
FIG. 7A illustrates an alternative ESD protection circuit with a level shifter, according to one embodiment of the invention.
Figure 8:
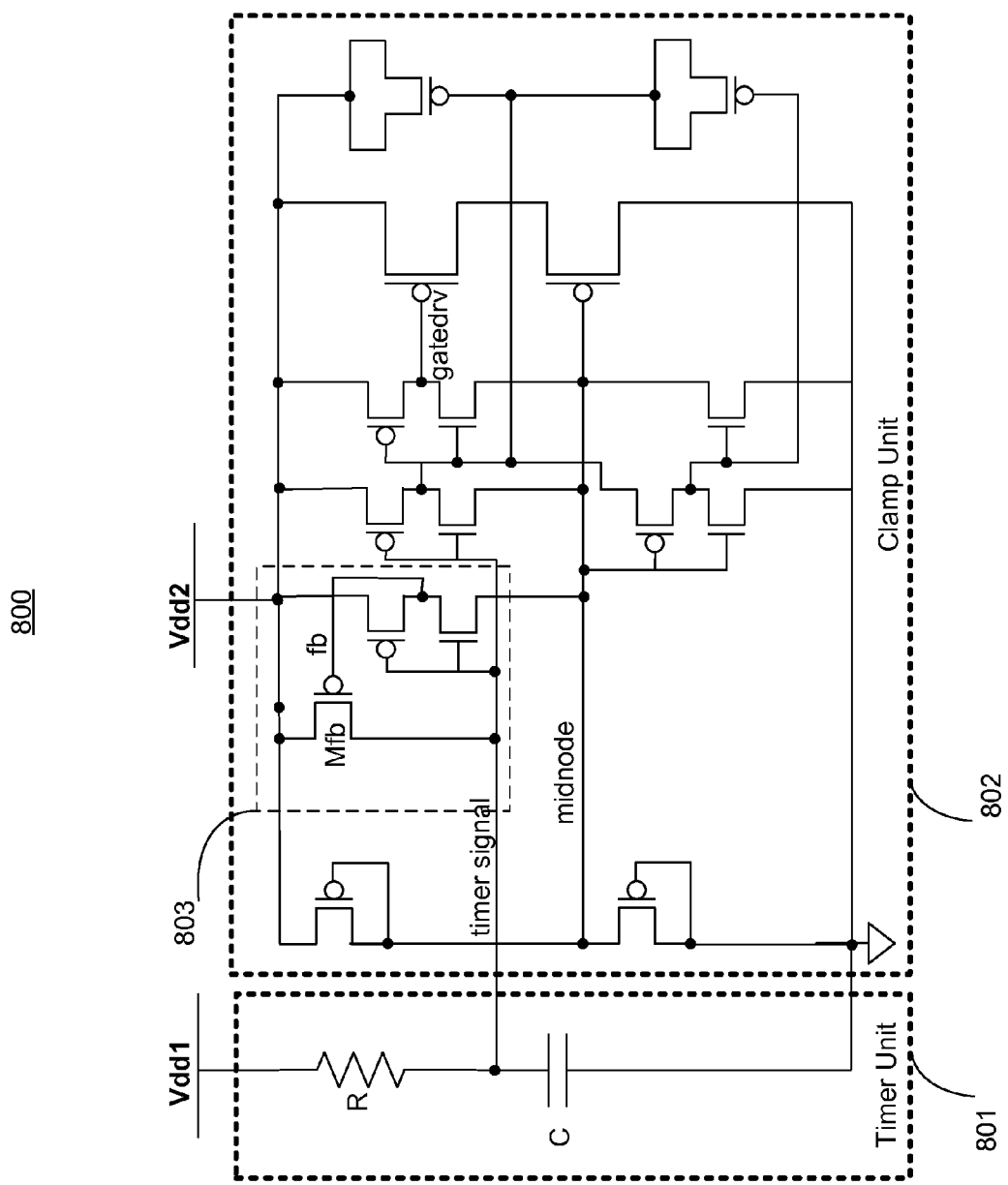
FIG. 8 illustrates another alternative ESD protection circuit, according to one embodiment of the invention.

FIG. 7A illustrates an ESD protection circuit 700 with a level shifter 702, according to one embodiment of the invention. In this embodiment, the ESD protection circuit 700 comprises a timer unit 701, the level shifter 702, and the clamp unit 703. In one embodiment, the timer unit 701 comprises an RC network coupled to a feedback unit operable to generate the feedback signal fb. In this embodiment, the first supply signal Vdd1 is higher than an allowable gate oxide voltage limit for the transistor process manufacturing technology. In one embodiment, the timer unit 701 operates on a divided first supply signal to avoid oxide breakdown for transistors.

In one embodiment, the output signal timerlv of the timer unit 701 is input to the level shifter 702. In one embodiment, the level shifter 702 is operable to generate a timerhv# signal from the timerlv signal. In one embodiment, the level shifter 702 is operable to keep the timerhv# signal at logical low level while the second supply signal Vdd2 is ramping up. In one embodiment, the level shifter 702 is operable to keep the timerhv# signal at a logical low level by using the first supply signal Vdd1 to power the pulldown device in the level shifter 702 via the timerlv signal. In such an embodiment, the timerhv# signal is a concave waveform shape that keeps the clamp devices off while the second supply signal ramps up.

Figure 7B:
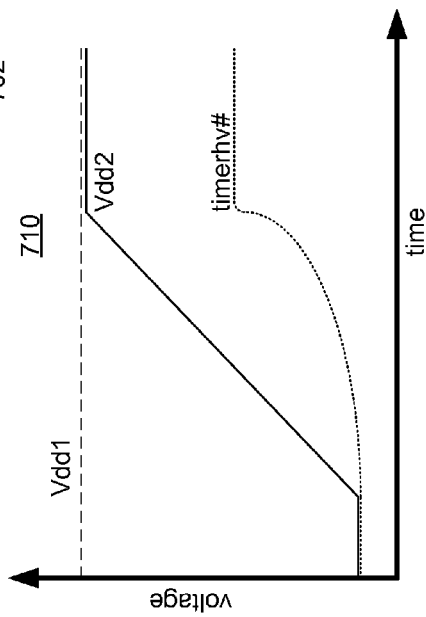
FIG. 7B illustrates a graph showing the operation of the level shifter signal of the alternative ESD protection circuit of FIG. 7A, according to one embodiment of the invention.

FIG. 7B illustrates a voltage-time graph 710 of a concave waveform shape of the timerhv# signal relative to the ramp of the second supply signal Vdd2, according to the embodiment of FIG. 7A.

In one embodiment, the output signals of the level shifter 701 (timerlv and timerhv#) are received by the clamp unit 703. In one embodiment, the clamp unit 703 is a stacked clamp unit compared to the clamp unit of FIG. 3B and FIG. 4B. In one embodiment, the devices in the clamp unit 703 are stacked to reduce the effects of oxide breakdown of the devices in the clamp unit 703. In one embodiment, the signal midnode is a bias signal set to a logical mid level of the second supply signal Vdd2 and the ground signal. In one embodiment, the midnode signal provides a raised ground level to the clamp device M1 to reduce the effects of oxide reliability. The overall operation of the ESD protection circuit 700 is the same as discussed above with reference to the embodiments of FIGS. 2-5. In one embodiment, another circuit topology may be used for the level shifter 702 without changing the essence of the invention of FIG. 7A.

FIG. 8 illustrates another embodiment 800 of an ESD protection circuit. This embodiment is similar to the embodiment of FIG. 4A and comprises a timer unit 801 coupled to a clamp unit 802 which is further coupled to a feedback unit 803. In this embodiment, when the second supply signal Vdd2 ramps down, the feedback unit 803 generating the fb signal will cause the timer signal to ramp down with the supply signal Vdd2 until the timer signal reaches a threshold voltage level (Vtp) of the feedback transistor $M_{fb}$. In such an embodiment, the resistor of the timer unit 801 keeps the node with the timer signal from dropping any lower that the threshold voltage level (Vtp) of the feedback transistor $M_{fb}$. In such an embodiment, when the second supply signal Vdd2 ramps back up, the inverter and the feedback PMOS device $M_{fb}$ of the feedback unit 803 behave as an amplifier to keep the timer node high. This alternative embodiment is in contrast to the embodiment of FIG. 4B, where the timer signal 203 remains high when the second supply signal Vdd2 ramps down.

Referring to FIG. 2, in an alternative embodiment, a voltage conversion unit (not shown) is added between the timer unit 201 and the clamp unit 202. In such an embodiment, the voltage conversion unit is operable to handle either alternate current (AC) or direct current (DC) differences between the first supply signal Vdd1 and the second supply signal Vdd2. In one embodiment, the voltage conversion unit is a resistor divider circuit. In other embodiments, the voltage conversion unit comprises a buffer voltage level shifter.

The embodiments of the invention are intended to embrace all such alternatives, modifications, and variations as to fall within the broad scope of the appended claims.

We claim:

1. An apparatus comprising:
   a timer unit having a node with a first supply signal, the timer unit to generate a first timer signal based on the first supply signal;
   a clamp unit, coupled to the timer unit, the clamp unit having a node with a second supply signal to clamp the second supply signal in response to electrostatic discharge (ESD), wherein the clamp unit to clamp for a duration based on a signal level of the first timer signal; and
   a feedback unit coupled to the clamp unit or to the timer unit, the feedback unit to adjust the first timer signal, wherein the feedback unit to adjust the first timer signal in response to the first or the second supply signals being ramped up or down.

2. The apparatus of claim 1, wherein the timer unit to generate the first timer signal with a time constant longer than the duration of an ESD event on the node with the second supply signal.

3. The apparatus of claim 1, wherein the first and the second supply signals correspond to a first power supply signal and a second power supply signal respectively.

4. The apparatus of claim 1, wherein the first and the second supply signals correspond to a first ground supply signal and a second ground supply signal respectively.

5. The apparatus of claim 1 further comprises:
   a first supply generator to generate the first supply signal; and
   a second supply generator to generate the second supply signal, wherein the first supply generator to ramp the first supply signal at a ramp speed slower than a ramp speed of the second supply signal.

6. The apparatus of claim 5, wherein the first supply generator to generate the first supply signal before the second supply generator generates the second supply signal, and wherein the second supply generator to turn itself off before the first supply generator turns itself off.

7. The apparatus claim 1 further comprises a level shifter coupled to the timer unit and the clamp unit, wherein the clamp unit to receive the second supply signal with a supply level higher than a supply level of the first supply signal, and wherein the level shifter to generate a second timer signal for the clamp unit from the first timer signal, the second timer signal having a signal level to protect reliability of the clamp unit.

8. The apparatus of claim 1 further comprises a level shifter coupled to the timer unit and the clamp unit.

9. The apparatus of claim 1, wherein the clamp unit comprises a PMOS transistor coupled to the node with the second supply signal and a node with a ground supply signal, wherein the second supply signal is a second power supply signal.

10. The apparatus of claim 1, wherein the clamp unit comprises an NMOS transistor coupled to the node with the second supply signal and a node with a power supply signal, wherein the second supply signal is a ground power supply signal.

11. The apparatus of claim 5, wherein the first voltage generator is an off-die voltage regulator.

12. An system comprising:
   a first voltage generator generate a first supply signal; and
   a processor coupled to the first voltage generator and comprising:
      a second voltage generator to generate a second supply signal, wherein the first supply generator to ramp the first supply signal at a ramp speed slower than a ramp speed of the second supply signal; and
      an electrostatic discharge (ESD) unit to:
         generate a first timer signal via the first supply signal; and
         clamp the second supply signal in response to ESD, the clamping for a duration based on the first timer signal.

13. The system of claim 11, wherein the first supply generator to generate the first supply signal before the second supply generator generates the second supply signal, and wherein the second supply generator to turn itself off before the first supply generator turns itself off.

14. The system of claim 11, wherein the ESD unit comprises:
   a timer unit having a node with the first supply signal, the timer unit to generate the first timer signal based on the first supply signal; and
   a clamp unit coupled to the timer unit and having a node with the second supply signal, the clamp unit to clamp the second supply signal.

15. The system of claim 14, wherein the clamp unit comprises a PMOS transistor coupled directly or indirectly to the node with the second supply signal and a node with a ground supply signal, wherein the second supply signal is a second power supply signal.

16. The system of claim 14, wherein the clamp unit comprises an NMOS transistor coupled directly or indirectly to the node with the second supply signal and a node with a power supply signal, and wherein the second supply signal is a ground power supply signal.

17. The system of claim 14, wherein the ESD unit further comprises a feedback unit coupled to the clamp unit or to the timer unit, the feedback unit to adjust the first timer signal in response to the first or the second supply signals being ramped up or down.

18. The system claim 14, wherein the ESD unit further comprises a level shifter coupled to the timer unit and the clamp unit, wherein the clamp unit to receive the second supply signal with a supply level higher than a supply level of the first supply signal, and wherein the level shifter to generate a second timer signal for the clamp unit from the first timer signal, the second timer signal having a signal level to protect reliability of the clamp unit.

19. The system of claim 12, wherein the first voltage generator is an off-die voltage regulator to generate the first supply signal with a ramp speed slower than a ramp speed of the second supply signal.

20. The system of claim 12, wherein the second voltage generator to generate the second supply signal with a ramp speed faster than a ramp speed of the first supply signal.

21. The system of claim 12, wherein the second voltage generator to generate a gated version of the first supply signal as the second supply signal.

22. A method comprising:
   generating a first timer signal via a timer unit having a node with a first supply signal, the first timer signal being based on the first supply signal;
   clamping a second supply signal in response to electrostatic discharge (ESD) on a node with the second supply signal for a duration based on the first timer signal; and
   ramping up or down the first and second supply signals at different speeds with respect to one another.

23. The method of claim 22 further comprises providing a time constant for the first timer signal longer than the duration of an ESD event on the node with the second supply signal.

24. The method of claim 22 further comprises generating the first supply signal with a ramp speed slower than a ramp speed of the second supply signal.

25. The method of claim 22 further comprises generating the first supply signal before generating the second supply signal.

26. A processor comprising:
   a voltage generator to receive a first supply signal and to generate a second supply signal based on the first supply signal; and
   an electrostatic discharge (ESD) unit including:
      a timer unit to generate a first timer signal via the first supply signal;
      a clamp unit, coupled to the timer unit, the clamp unit capable of clamping the second supply signal in response to ESD, the clamping for a duration based on the first timer signal; and
      a feedback unit coupled to the clamp unit or to the timer unit, the feedback unit to adjust the first timer signal, wherein the feedback unit to adjust the first timer signal in response to the first or the second supply signals being ramped up or down.

27. The processor of claim 26, wherein the first supply signal is generated via a first supply generator which is operable to ramp the first supply signal at a ramp speed slower than a ramp speed of the second supply signal.

28. The processor of claim 26, wherein the timer unit has a node with the first supply signal, the timer unit to generate the first timer signal based on the first supply signal; and
   wherein the clamp unit has a node with the second supply signal, and wherein the clamp unit being capable to clamp the second supply signal.

* * * * *